United States Patent
Bouchakour et al.

(10) Patent No.: US 7,675,106 B2
(45) Date of Patent: Mar. 9, 2010

(54) NON-VOLATILE REPROGRAMMABLE MEMORY

(75) Inventors: Rachid Bouchakour, Marseilles (FR); Virginie Bidal, Aix en Provence (FR); Philippe Candelier, Saint Mury Monteymond (FR); Richard Fournel, Lumbin (FR); Philippe Gendrier, Grenoble (FR); Romain Laffont, Marseilles (FR); Pascal Masson, Marseilles (FR); Jean-Michel Mirabel, Cabries (FR); Arnaud Regnier, Le Tholonet (FR)

(73) Assignees: STMicroelectronics S.A., Montrouge (FR); STMicroelectronics SAS, Rousset (FR); France Universite d'Aix-Marseille, Marseille (FR)

( * ) Notice: Subject to any disclaimer, the term of this patent is extended or adjusted under 35 U.S.C. 154(b) by 666 days.

(21) Appl. No.: 11/525,529

(22) Filed: Sep. 22, 2006

(65) Prior Publication Data

US 2007/0069278 A1    Mar. 29, 2007

(30) Foreign Application Priority Data

Sep. 23, 2005  (FR) .................................. 05 52849

(51) Int. Cl.
    *H01L 29/423*  (2006.01)
(52) U.S. Cl. ................................ 257/315; 257/E29.136
(58) Field of Classification Search ........................ None
    See application file for complete search history.

(56) References Cited

U.S. PATENT DOCUMENTS

| | | | | |
|---|---|---|---|---|
| 5,554,552 A * | 9/1996 | Chi | ............................. | 438/264 |
| 5,633,518 A * | 5/1997 | Broze | ......................... | 257/314 |
| 5,950,088 A * | 9/1999 | Park | ........................... | 438/266 |
| 6,017,792 A * | 1/2000 | Sharma et al. | .............. | 438/257 |
| 6,191,980 B1* | 2/2001 | Kelley et al. | ........... | 365/185.29 |
| 6,509,606 B1* | 1/2003 | Merrill et al. | ............... | 257/321 |
| 7,085,179 B2* | 8/2006 | Park et al. | .................... | 365/200 |
| 7,333,362 B2* | 2/2008 | Gendrier et al. | ........ | 365/185.01 |
| 2003/0006431 A1 | 1/2003 | Skotnicki et al. | | |
| 2003/0216000 A1* | 11/2003 | Beaman et al. | ............. | 438/257 |
| 2004/0062108 A1* | 4/2004 | Dray et al. | .................. | 365/202 |
| 2005/0219912 A1 | 10/2005 | Gendrier et al. | | |

OTHER PUBLICATIONS

French Search Report from corresponding French Application No. 0552849, filed Sep. 23, 2005.

* cited by examiner

*Primary Examiner*—Sue Purvis
*Assistant Examiner*—Benjamin P Sandvik
(74) *Attorney, Agent, or Firm*—Lisa K. Jorgenson; William R. McClellan; Wolf, Greenfield & Sacks, P.C.

(57) ABSTRACT

A non-volatile memory point including a floating gate placed above a semiconductor substrate, the floating gate comprising active portions insulated from the substrate by thin insulating layers, and inactive portions insulated from the substrate by thick insulating layers that do not conduct electrons, the active portions being principally P-type doped, and the inactive portions comprising at least one N-type doped area forming a portion of a PN junction.

19 Claims, 5 Drawing Sheets

NON-VOLATILE REPROGRAMMABLE MEMORY

BACKGROUND OF THE INVENTION

1. Field of the Invention

The present invention relates to a non-volatile memory and more specifically to a reprogrammable memory point.

2. Discussion of the Related Art

Figure 1:
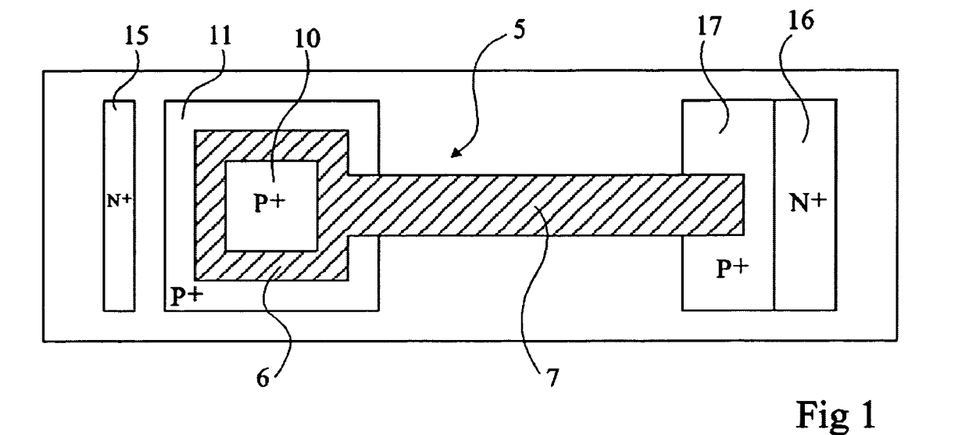
FIGS. 1 and 2 respectively are a top view and a cross-section view of a previously-described non-volatile memory point.
Figure 2:
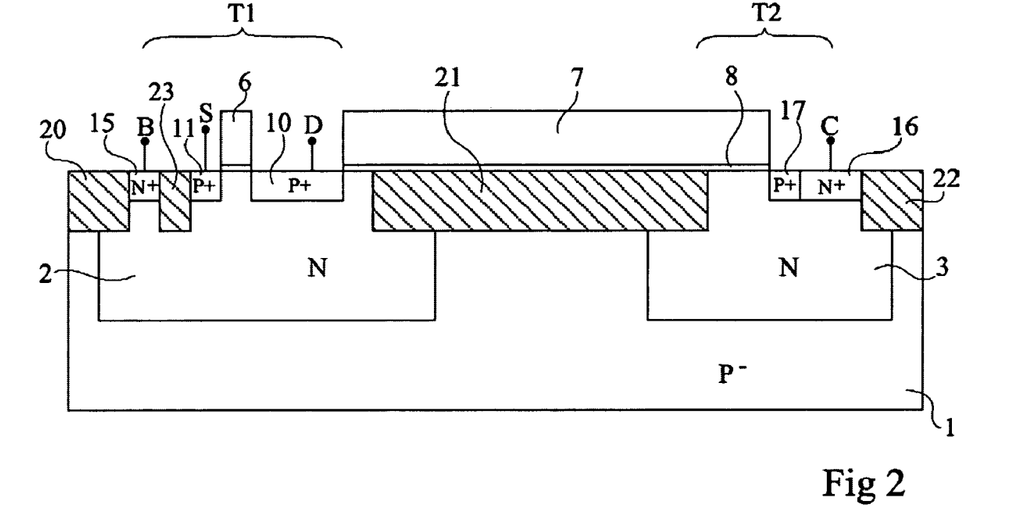

FIGS. 1 and 2, respectively, are a top view and a cross-section view of a non-volatile memory point. This memory point is described in International patent application WO 03/088366 which is incorporated herein by reference. This memory point is formed in and above a semiconductor substrate 1, for example, made of lightly-doped P-type silicon. Two N-type doped wells 2 and 3 are respectively formed to the left and to the right of FIG. 2. A floating gate 5, for example, made of polysilicon, is placed on substrate 1. Floating gate 5 comprises a substantially ring-shaped portion 6 placed above well 2 and which extends in a rectilinear portion 7, having its end placed above well 3. Floating gate 5 is insulated from the substrate by a thin insulating layer 8, for example, silicon oxide. A heavily-doped P-type area 10 is placed at the surface of N well 2 inside of ring-shaped portion 6 in top view. A heavily-doped P-type area 11 is placed at the surface of N well 2 all around ring-shaped portion 6 in top view. A heavily-doped N-type well contact area 15 is placed at the surface of N well 2. Similarly, a heavily-doped N-type well contact area 16 is formed at the surface of N well 3 to the right thereof. A heavily-doped P-type area 17 is formed at the surface of N well 3 to the left of $N^+$ region 16 and all around, in top view, rectilinear portion 7 of floating gate 5. N wells 2 and 3 are surrounded with an insulating area formed in the upper portion of substrate 1. Three portions 20, 21, and 22 of this insulating area are visible respectively to the left of well 2, between wells 2 and 3, and to the right of well 3. Further, $N^+$ area 15 and $P^+$ area 11 are separated by an insulating area 23 formed in the upper portion of N well 2. Heavily-doped areas 10, 11, 15, 16, and 17, as well as floating gate 5 are covered with silicide layers, not shown.

Figure 3:
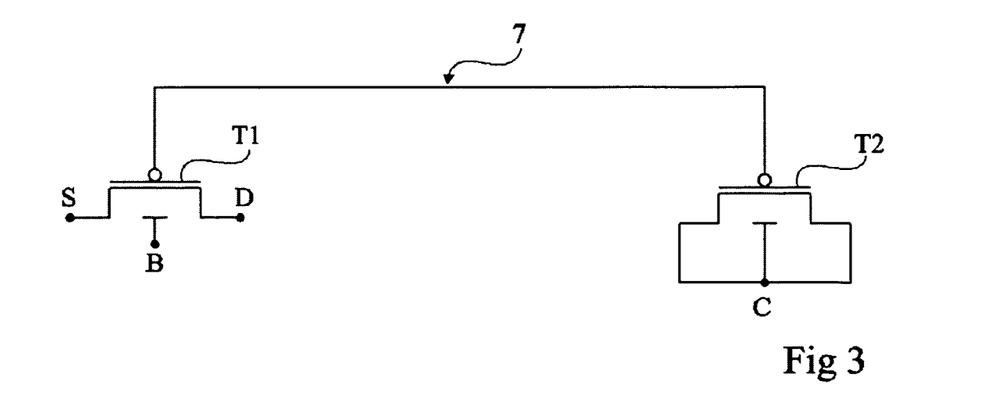
FIG. 3 is an equivalent electric diagram of the memory point shown in FIGS. 1 and 2.

FIG. 3 is an equivalent electric diagram of the memory point of FIGS. 1 and 2. Ring-shaped portion 6 of floating gate 5 forms the gate of a P-channel K transistor (PMOS) T1. $P^+$ areas 10 and 11 respectively form a drain area D and a source area S. N well 2 forms "bulk" B of transistor T1. The end of rectilinear portion 7 of floating gate 5 forms the gate of a PMOS transistor T2. $P^+$ area 17 is both the source area and the drain area of transistor T2. The source and drain areas are short-circuited and connected to the substrate of transistor T2, which is formed by N well 3, via the silicide layer covering $P^+$ and $N^+$ areas 16 and 17. N well 3 and $P^+$ and $N^+$ areas 16 and 17 form a control electrode C of the memory point. The gates of PMOS transistors T1 and T2 are connected via floating gate portion 7. References B, D, S, and C have been written again in FIG. 2 for clarity.

The memory point programming or erasing respectively comprises the injection of electric charges into floating gate 5 or the elimination thereof. Methods for programming, erasing, or reading from such a memory point are described in detail in the above-mentioned International patent application.

A well-known problem of non-volatile memory points is the "leakage" of the charges stored in the floating gate. In the previously-described memory point example, the charges stored in floating gate 5 tend to pass, by tunnel effect, through insulating layer 8 towards the semiconductor regions of transistors T1 and T2. Such tunnel-effect charge leakages become more significant as insulating layer 8 becomes thin. Further, the multiple operations of programming and erasing of such memory points result in deteriorating the quality of thin insulating layer 8 and in further increasing tunnel-effect leakages.

SUMMARY OF THE INVENTION

An object of the present invention is to provide a non-volatile memory point comprising a floating gate which exhibits a very good retention capacity for the electric charges stored therein.

Another object of the present invention is to provide such a memory point which keeps a very good electric charge retention capacity whatever the number of performed programming and erasing operations.

Another object of the present invention is to provide such a memory point of simple structure.

To achieve these and other objects, the present invention provides a non-volatile memory point comprising a floating gate placed above a semiconductor substrate, the floating gate comprising active portions insulated from the substrate by thin insulating layers, and inactive portions insulated from the substrate by thick insulating layers that do not conduct electrons, the active portions being, as a majority P-type doped, and the inactive portions comprising at least one N-type doped area forming a portion of a PN junction.

According to an embodiment of the above-mentioned memory point, the thick insulating layers are placed in the upper portion of the substrate and insulate several areas of the semiconductor substrate such as wells.

According to an embodiment of the above-described memory point, the memory point further comprises means of electron transfer from said N-type doped area, forming a well of storage of electrons injected into the floating gate in a programming operation, towards all or part of the active portions.

According to an embodiment of the above-mentioned memory point, said transfer means comprise at least one coupling electrode placed close to said at least one N-type doped area and separated therefrom by an insulating portion, said at least one coupling electrode being connected to a biasing electrode.

According to an alternative embodiment of the above-described memory point, first and second wells of a first doping type are placed in the upper portion of the substrate of a second doping type, the floating gate comprising a ring-shaped active portion placed above the first well, a non-active portion placed above an insulating area placed in the upper portion of the substrate between the first and second wells, and an active end portion placed above the second well, drain and source areas of the second doping type being placed at the surface of the first well respectively inside and outside, in top view, of the active ring-shaped portion.

According to an alternative embodiment of the above-mentioned memory point, the ring-shaped active portion and the end active portion are P-type doped and the inactive portion is N-type doped.

According to an alternative embodiment of the above-mentioned memory point, the ring-shaped active portion and the end active portion are P-type doped, and the inactive portion comprises several N-type doped areas separated from one another by P-type doped areas.

According to an alternative embodiment of the above-described memory point, the ring-shaped active portion and the end active portion are P-type doped, the inactive portion comprising a P-type doped rectilinear portion exhibiting lateral prominences having N-type doped ends.

According to an alternative embodiment of the above-described memory point, the memory point comprises electrode areas placed close to the inactive portion and exhibiting prominences placed close to the N-type doped areas.

According to an alternative embodiment of the above-described memory point, the memory point comprises a stack of a first insulating layer, a floating gate, a second insulating layer, and a control gate, the stack being placed above a semiconductor substrate perpendicularly to an upper strip of the substrate surrounded by an insulating area placed in the upper substrate portion, source/drain areas being formed in the upper substrate strip on either side of the stack, the central portion of the floating gate placed above the upper substrate strip forming an active P-type doped portion, and the end portions of the floating gate forming inactive N-type doped portions.

The foregoing and other objects, features, and advantages of the present invention will be discussed in detail in the following non-limiting description of specific embodiments in connection with the accompanying drawings.

DETAILED DESCRIPTION

For clarity, the same elements have been designated with the same reference numerals in the different drawings and, as is usual in the representation of integrated circuits, FIGS. 1, 2, 4A, 4B, 7, 9, 11A, 11B, and 11C are drawn not to scale.

To limit leakage of the electrons stored in the floating gate of a non-volatile memory point, the present invention provides "trapping", during retention periods, the charges of the floating gate in locations thereof provided on thick insulating layers that do not conduct electrons. Such trapping locations are electron wells formed by means of one or several PN semiconductor junctions formed in the floating gate.

Examples of non-volatile memory points according to the present invention are described hereafter.

Figure 4A:
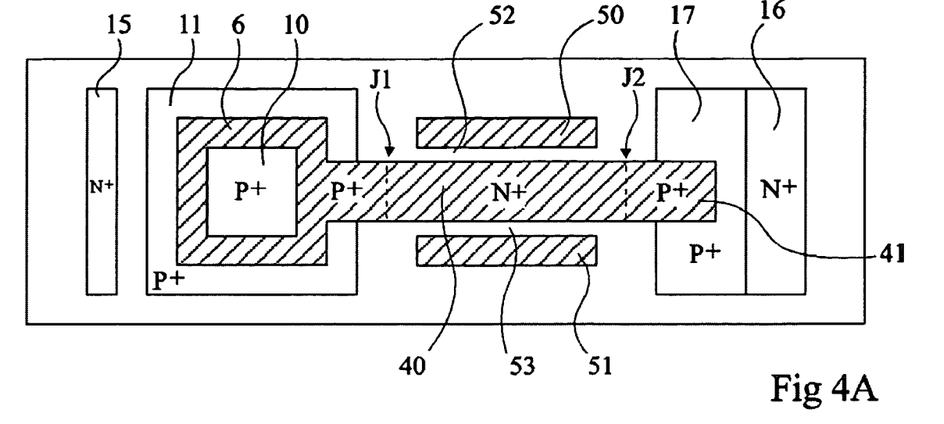
FIGS. 4A and 4B respectively are a top view and a cross-section view of a memory point, of the type shown in FIGS. 1 and 2, according to an embodiment of the present invention.
Figure 4B:
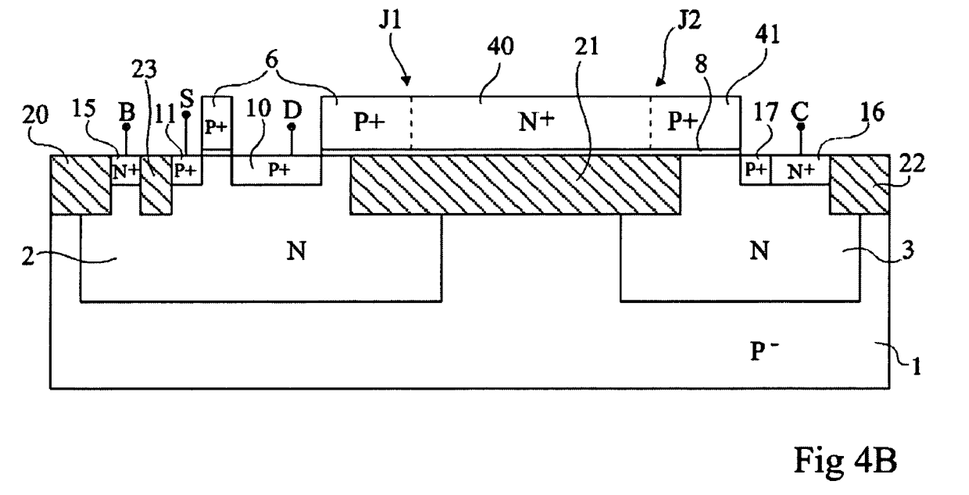

FIGS. 4A and 4B respectively are a top view and a cross-section view of a memory point identical to that shown in FIGS. 1 and 2, except that the doping of floating gate 5 is not uniform and that said gate is not covered with a silicide layer. The portion of floating gate 5 placed above insulating area 21, called intermediary portion 40 hereafter, is heavily N-type doped. The end of rectilinear portion 7, called end portion 41 hereafter, is heavily P-type doped. Ring-shaped portion 6 is heavily P-type doped. Two PN junctions J1 and J2 are thus formed on the one hand by ring-shaped portion 6 and intermediary portion 40, and on the other hand by intermediary portion 40 and end portion 41.

Generally, a floating gate of a non-volatile memory point is a conductive region, not connected to an external terminal, formed at least partly above semiconductor regions with an interposed insulating layer. This floating gate has the function of making a channel region of a MOS transistor, between drain and source regions conductive or not. The floating gate portion placed above such a channel region is called an active portion in the present description. The floating gate portions placed above insulating layers through which electrons transit in programming or erasing operations will also be called active portions. Such active portions form electron reception/emission areas. The other floating gate portions are said to be inactive.

In the memory point example shown in FIG. 4B, ring-shaped portion 6 is an electron reception area in hot-electron programming operations, and it forms the gate of transistor T1. End portion 41 is an emission area in erasing operations or a reception area in Fowler-Nordheim tunnel effect programming operations. Ring-shaped portion 6 and end portion 41 thus are active portions of the floating gate. Intermediary portion 40 is an inactive portion of the floating gate.

Figure 5:
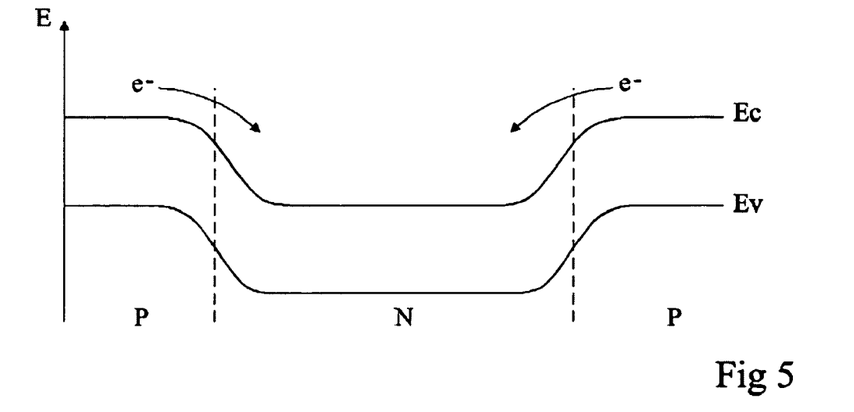
FIG. 5 is a diagram illustrating the energy bands of the floating gate of the memory point shown in FIGS. 4A and 4B.

FIG. 5 is a power diagram illustrating the shape of valence band Ev and of conduction band Ec of the rectilinear portion of floating gate 5, in the absence of biasing of the memory point electrodes. It can be observed that $N^+$ intermediary portion 40 forms an electron "well". The amount of electrons that can be stored in the well is a function, among other things, of the concentration in doping elements of each of the floating gate portions. As a first approximation, the amount of electrons that can be stored in a well is proportional to the amount of ionized donors present in intermediary $N^+$ portion 40 at the level of the space charge areas of junctions J1 and J2 at thermal equilibrium, that is, out of any electron storage in the floating gate.

In the present description of a non-volatile memory point comprising a floating gate, an insulating layer placed between this floating gate and a conductive area, such as a portion of the substrate in which the memory point is formed, is considered as being thick since it cannot be crossed by electrons. The minimum thickness that such an insulating layer must have is a function of the maximum voltage capable of existing through this insulating layer between the floating gate and a neighboring conductive area. It can be considered that an insulating layer separating the floating gate from a conductive layer is thick inasmuch as it is at least 10 times as thick as the "thin" insulating layers of the memory point that conduct electrons in programming or erasing phases.

In the memory point example shown in FIG. 4B, active portions 6 and 41 are insulated from the substrate by thin insulating portion 8 and inactive portion 40 is insulated from the substrate by insulating portion 21 covered with thin insulating layer 8. The thin insulating layer, for example, has a 5-nanometer thickness and insulating portion 21 has a 0.35-micrometer thickness. There then is a ratio of 70 between the thicknesses of the thin and thick insulating layers respectively placed under the active areas and under the inactive areas.

An advantage of a memory point according to the present invention is that the confining of all or part of the electrons stored in the floating gate at the level of an inactive area insulated from the substrate by a thick layer enables eliminating any risk of leakage by tunnel effect of these electrons during retention periods.

It should be noted that the electron confinement in intermediary N$^+$ portion 40 results in limiting the influence of electrons on the biasing of the gate of transistor T1. In other words, this decreases, in absolute value, the threshold voltage of transistor T1, called VT4 in the above-mentioned International patent application. Accordingly, the read current crossing transistor T1 is smaller than that measured for a memory point comprising a uniformly-doped floating gate. To overcome this disadvantage, coupling electrode areas 50 and 51 may be placed opposite to N$^+$ intermediary portion 40 and insulated therefrom by insulating portions 52 and 53. Coupling electrodes 50 and 51 are in this example placed above insulating area 21. By capacitive coupling, it is possible to vary the electric voltage of intermediary N portion 40 by applying an adequate voltage onto coupling electrode areas 50 and 51. Coupling electrodes 50 and 51 are for example formed of polysilicon, like floating gate 5.

In read or erase operations, the electrons can be pulled out of the well formed at the level of intermediary N portion 40 by the biasing of coupling electrode areas 50 and 51 to a low voltage, typically the ground. Such a biasing of intermediary N portion 40 enables "raising" the energy levels of valence and conduction bands Ev and Ec of this portion, and decreasing or eliminating the electron well. The electrons present in the gate then distribute in the floating gate according to the capacitive couplings between the floating gate and the conductive areas located close to the floating gate. In addition to the capacitive coupling with coupling electrode areas 50, 51, the voltage of floating gate 5 is a function of the capacitive couplings formed with two control areas of the memory point shown in FIGS. 4A and 4B. The first control area is formed of N well 3 and of P$^+$ area 17 surrounding end portion 41 of the floating gate. The second control area is formed of N well 2 and of P$^+$ source/drain areas 10 and 11.

In a "hot electron" programming operation, it may be useful to "hollow" the electron wells by positioning the coupling electrode areas at a relatively high voltage.

In a Fowler-Nordheim effect programming operation, on the side of N well 3, it is, however, preferable to bias coupling electrode areas 50 and 51 to a low voltage such as the ground.

Further, when no operation is performed on the memory point, a high voltage is preferably applied to the coupling electrode areas to hollow the electron wells and thus increase the retention capacities of the memory point.

As a non-limiting example, the biasing voltages of the various portions of a memory point such as shown in FIGS. 4A and 4B are given hereafter. The voltages applied on the P$^+$ drain area, on the P$^+$ source area, on N well 2, on N well 3, and on control electrodes 50, 51 are respectively designated as Vd, Vs, Vb, Vc, and Vp.

| Operation | Vs | Vb | Vd | Vc | Vp |
|---|---|---|---|---|---|
| Hot-electron programming | 5 V | 5 V | 0 V | 5/0 V | 2.5 V |
| Fowler-Nordheim programming | 11 V | 11 V | 11 V | 0 V | 0 V |
| Erasing | 0 V | 0 V | 0 V | 7 V | 0 V |
| Reading | 2.5 V | 2.5 V | 1.5 V | 2.5 V | 0 V |
| None (retention) | 2.5 V | 2.5 V | 2.5 V | 2.5 V | 2.5 V |

Coupling electrodes 50 and 51 biased to adequate voltages form means of electron transfer to ring-shaped and end portions 6 and 41. Other means of electron transfer from an inactive portion to an active portion of the floating gate may be used. Another example of electron transfer means comprises the biasing of N well 3, of P$^+$ drain/source areas 10, 11, and of N well 2 so that, by capacitive coupling, the different floating gate portions are at different voltages and that a voltage gradient is created between end portion 41 and ring-shaped portion 6. In a read operation, it is then seen to it that the voltage of end portion 41 is smaller than that of ring-shaped portion 6 and conversely in an erasing operation.

Figure 6:
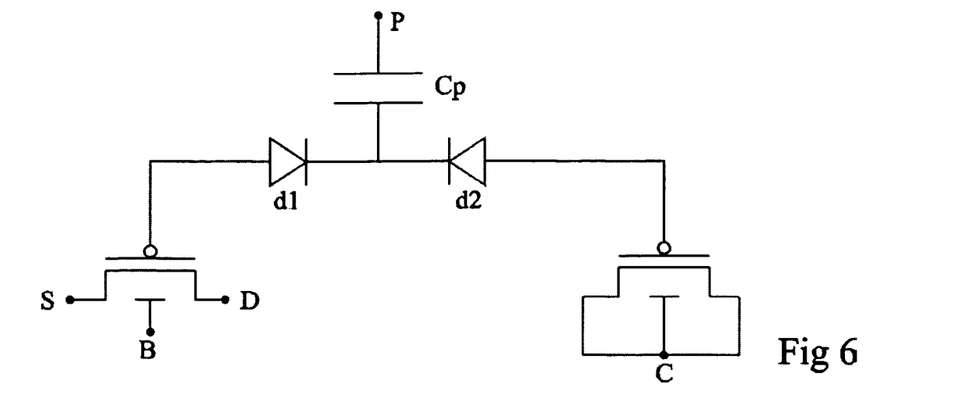
FIG. 6 is an equivalent electric diagram of the memory point shown in FIGS. 4A and 4B.

FIG. 6 is an equivalent electric diagram of the memory point shown in FIGS. 4A and 4B. As in the diagram of FIG. 3, the memory point comprises a transistor T1, the source, drain, and substrate of which can be separately biased, as well as a transistor T2, the source, drain, and substrate of which are connected to a control electrode C. The gates of transistors T1 and T2 are connected by two diodes d1 and d2 head-to-tail. The cathodes of diodes d1 and d2 are connected to an electrode of a capacitor Cp having its other electrode connected to a bias terminal P. Diode d1 corresponds to PN junction J1 and diode d2 corresponds to PN junction J2. Capacitor Cp corresponds to the capacitor formed by intermediary N portion 40, coupling electrode areas 50 and 51, and thin insulating portions 52 and 53.

The number of electrons that can be trapped in a well is not infinite. Further, the number of electrons stored in a floating gate is generally much greater than the number of electrons that can be stored in a single well. In the case where the gate comprises PN junctions formed of heavily-doped P and N areas, with concentrations greater than $10^{17}$ atoms/cm$^3$, there may be a ratio of 10 between the number of electrons stored in the floating gate and the number of electrons stored in a well. To increase the number of electron trapping locations in the floating gate, it is possible to provide a large number of PN junctions above insulating area 21 of the memory point shown in FIG. 4B, between ring-shaped portion 6 and end portion 41 of the floating gate.

Figure 7:
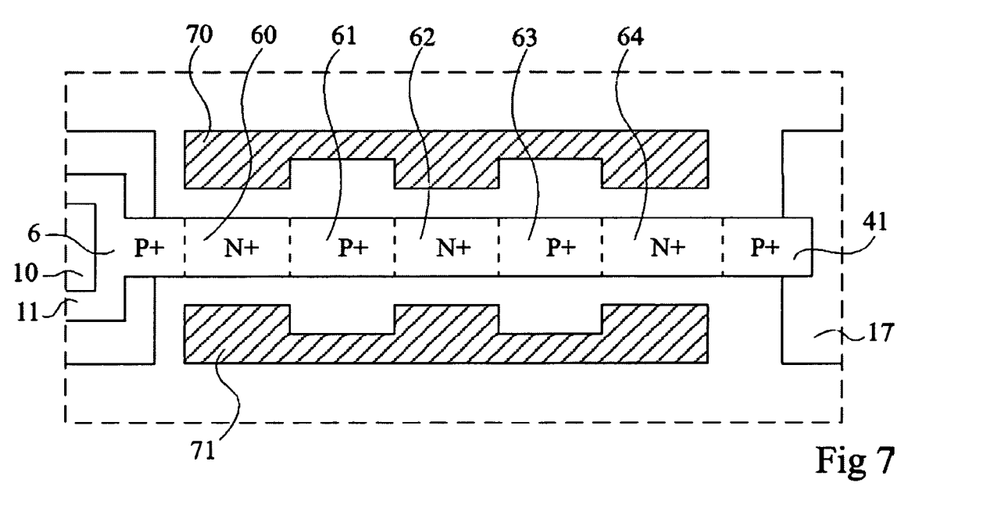
FIG. 7 is a top view of a memory point, of the type shown in FIGS. 1 and 2, according to another embodiment of the present invention.

FIG. 7 is a top view of such a memory point in which ring-shaped portion 6 and end portion 41 are, as previously, heavily P-type doped and in which the single intermediary portion 40 is replaced with five intermediary alternately N-type and P-type doped portions 60, 61, 62, 63, and 64. Six PN junctions J1 to J6 are then formed above insulating area 21. The floating gate comprises 3 electron wells placed at the level of each of N-type doped intermediary portions 60, 62, and 64.

In order, as previously, to eliminate or hollow the electron wells, coupling electrode areas 70 and 71 are placed on either side of the assembly of intermediary portions 60 to 64. Each coupling electrode area 70 and 71 has, in this example, a substantially rectilinear shape and exhibits prominences opposite to intermediary N$^+$ portions 60, 62, and 64. To be able to efficiently modulate the "depth" of the electron well, the shape of coupling electrode areas 70 and 71 must be such that the capacitive coupling is greater with intermediary N$^+$ portions 60, 62, and 64 than with intermediary P$^+$ portions 61 and 63.

The operation of such a memory point is identical to that previously described for the memory point shown in FIGS. 4A and 4B.

Figure 8:
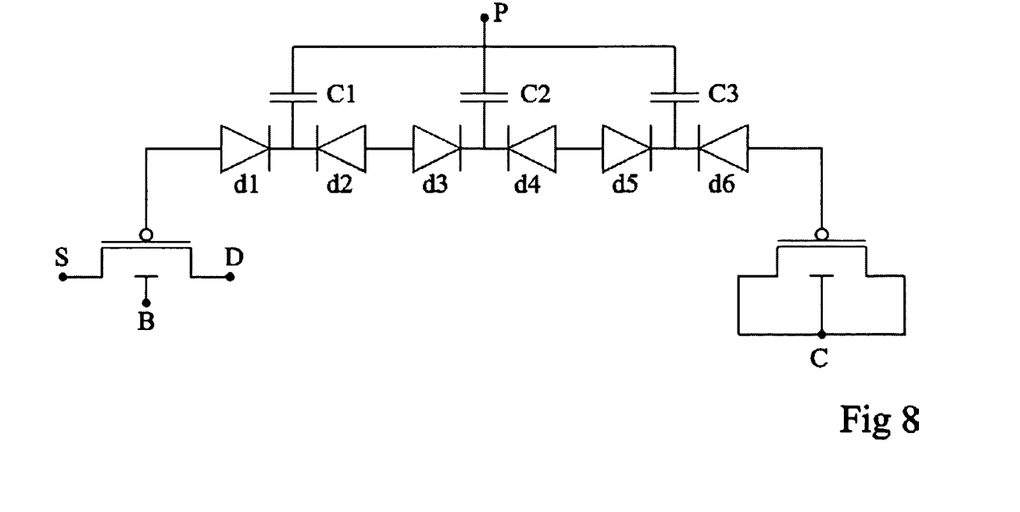
FIG. 8 is an equivalent electric diagram of the memory point shown in FIG. 7.

FIG. 8 is an equivalent electric diagram of the memory point of FIG. 7. This memory point comprises, as previously, two transistors T1 and T2. The gates of transistors T1 and T2 are connected by six diodes, head-to-tail two by two. The cathodes of each couple of head-to-tail diodes are connected to an electrode of a capacitor C1, C2, or C3. The other electrodes of capacitors C1, C2, and C3 are connected together to a bias terminal P.

Figure 9:
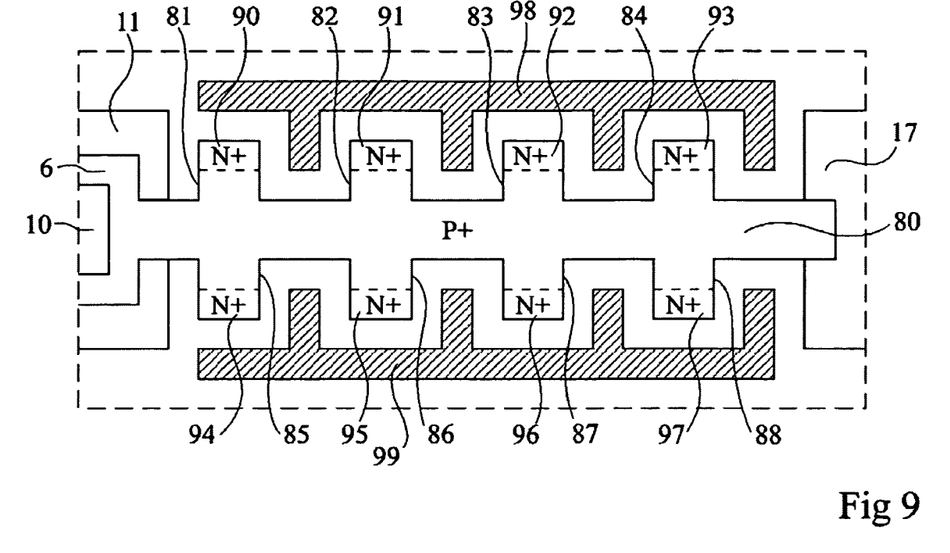
FIG. 9 is a top view of a memory point, of the type shown in FIGS. 1 and 2, according to another embodiment of the present invention.

FIG. 9 is a top view of an alternative embodiment of the memory point shown in FIGS. 4A and 4B in which the single intermediary portion 40 is replaced with a rectilinear portion 80 exhibiting lateral prominences. In this example, four lateral prominences 81, 82, 83, and 84 are shown at the top of the drawing and four lateral prominences 85, 86, 87, and 88 are shown at the bottom of FIG. 9. Rectilinear portion 80 is heavily P-type doped and ends 90 to 98 of lateral prominences 81 and 88 are heavily N-type doped. The floating gate comprises 8 PN junctions formed at the level of each of lateral prominences 81 to 88.

As previously, to modulate the depth of the electron wells, two coupling electrode areas 98 and 99 are respectively placed opposite to prominences 81 to 84 and prominences 85 to 88. Coupling electrode areas 98 and 99 each comprise a substantially rectilinear portion exhibiting lateral prominences in the shape of a comb inserted between the lateral prominences of the floating gate.

Figure 10:
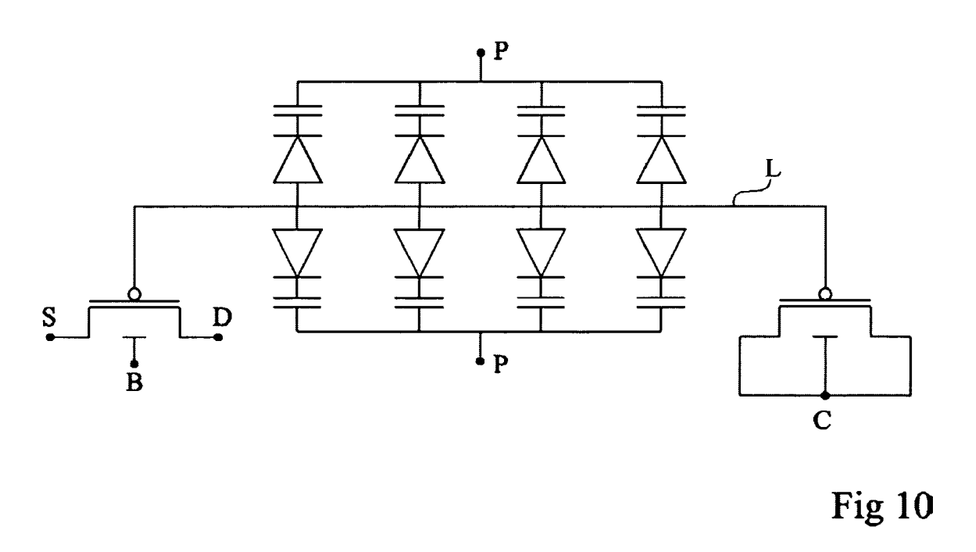
FIG. 10 is an equivalent electric diagram of the memory point shown in FIG. 9.

FIG. 10 is an equivalent electric diagram of the memory point of FIG. 9. This memory point comprises, as previously, two transistors T1 and T2. The gates of these two transistors are connected by a conductive line L. Conductive line L is connected to the anodes of eight diodes d1 to d8. Each diode d1 to d8 is, on its cathode side, connected to an electrode of a capacitor C1 to C8. The other electrodes of capacitors C1 to C8 are interconnected to a bias terminal P.

The operation of the memory point shown in FIG. 9 is identical to that of the memory point shown in FIGS. 4A and 4B.

Other alternative embodiments of the memory point shown in FIGS. 4A/4B may be devised. Intermediary portion 40 may be replaced with other structures exhibiting electron wells at the level of which a trapping may be performed.

Further, end portion 41, heavily P-type doped in the previously-described examples of embodiment, may comprise at its end an N-type doped area. This N area enables easing erasing operations and especially decreasing the used erasing voltage. The presence of this N area creates a P/N junction and thus an electron well which is separated from well 3 by thin insulating layer 8. This adversely affects the retention of the electrons "stored" in this well. To avoid significantly impairing the retention capacities of the memory point, the presence of at least 2 or 3 P/N junctions placed above insulating area 21 is then desirable.

Figure 11A:
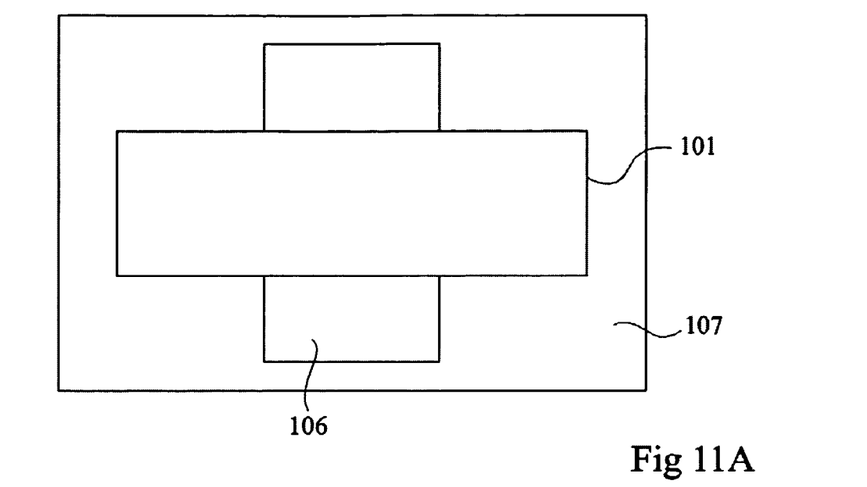
FIGS. 11A, 11B, and 11C respectively are a top view, a first cross-section view, and a second cross-section view of another type of non-volatile memory point according to the present invention.
Figure 11B:
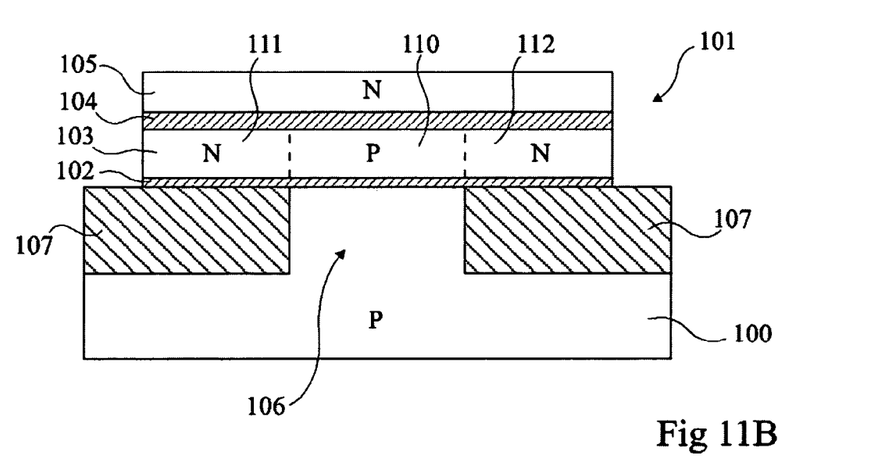
Figure 11C:
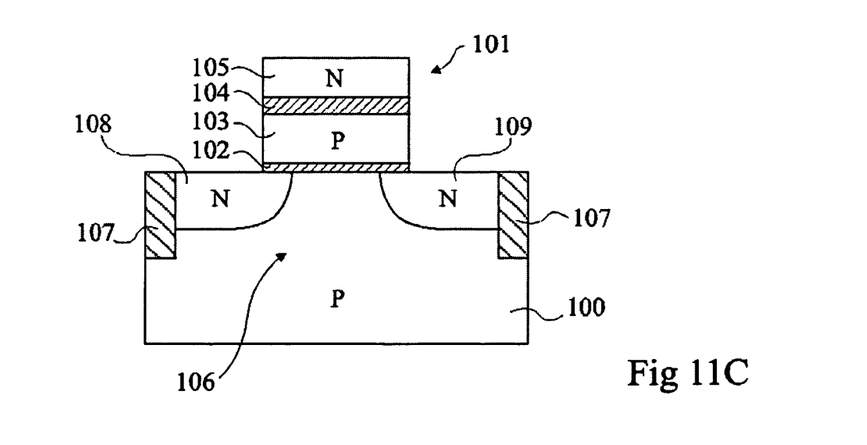

FIGS. 11A, 11B, and 11C respectively are a top view, a first cross-section view, and a second cross-section view of a non-volatile memory point according to the present invention, of another type than that described previously. This FLASH-type memory point is formed in and above a P-type substrate 100. It comprises a stack 101 of a thin insulating layer 102, a floating gate 103, an insulating layer 104, and a control gate 105. Stack 101, of substantially rectangular shape, is placed above the substrate substantially perpendicularly to an upper strip of substrate 106 surrounded by an insulating area 107 placed in the upper substrate portion. The portions of upper substrate portion 106 located on either side of stack 101 are N-type doped and form source and drain areas 108 and 109.

The programming of such a memory point, aiming at injecting electrons into floating gate 103, is of "hot electron" type. P substrate 100 and source area 108 are biased to a low voltage, for example, to ground, and drain area 109 and control gate 105 are biased to a high voltage, for example, 5 V. The presence of a strong source/drain current causes the creation of electron-hole pairs in the channel area, under stack 101, and an electron flow through thin insulating layer 102 to floating gate 103.

The erasing of such a memory point, aiming at eliminating the electrons present in the floating gate, is of "Fowler-Nordheim" type. Substrate 100 and control gate 105 are biased to a low voltage, for example, to ground, source area 108 is biased to a high voltage, for example, 8 V, and the drain area is at high impedance.

On reading of such a memory point, control gate 105 is biased to a relatively high voltage, for example, 3 V, substrate 100 is biased to ground and a voltage, for example, 1 V, is applied between source and drain areas 108 and 109.

According to an aspect of the present invention, central portion 110 of floating gate 103, placed above upper substrate strip 106, is P-type doped and end portions 111 and 112 of the floating gate, placed above insulating area 107, are N-type doped. The two end portions 111 and 112 form electron wells. Thus, the electrons injected into the floating gate are stored at the level of end portions 111 and 112.

The examples of bias voltages previously discussed for the read and erasing operations enable transferring the electrons stored in end portions 111 and 112 to central portion 110. Other means for transferring the electrons outside of the end portions may be provided. Coupling electrodes may, for example, be placed on either side of the end portions and the latter may be biased to adequate voltages to "empty" or possibly to "hollow" the electron wells.

The central portion is an electron reception/emission area in programming or erasing phases as well as a transistor gate by interacting by capacitive coupling with the doped areas of upper substrate strip 106. The central portion thus is an active portion of the floating gate. End portions 111 and 112 are inactive portions used for the electron storage.

The electrons are thus stored in portions of the floating gate separated from the substrate by insulating area 107 which forms a "thick" insulating layer that does not conduct electrons.

Further, the electrons are stored far from the "thin" insulating layers of the memory point through which electrons transit in programming or erasing operations.

An advantage of a memory point according to the present invention thus is that it exhibits a very good electric charge retention capacity, and this, whatever the number of memory point programming and erasing operations.

Of course, the present invention is likely to have various, alterations, improvements, and modifications which will readily occur to those skilled in the art. In particular, the present invention is not limited to the types of memory points shown in FIGS. 4A/4B and 11A/11B/11C. The present invention applies to any type of non-volatile memory point comprising a floating gate exhibiting an inactive portion insulated from a semiconductor substrate by a thick insulating layer that does not conduct electrons.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A non-volatile memory point comprising:
a floating gate placed above a semiconductor substrate, the floating gate comprising active portions insulated from the substrate by thin insulating layers, and inactive portions insulated from the substrate by thick insulating layers that do not conduct electrons, wherein:

at least the main part of the active portions has a P-type doping and the inactive portions comprise at least one N-type doped area forming a portion of a PN junction;

first and second wells of a first doping type are placed in an upper portion of the substrate of a second doping type;

the floating gate comprises a ring-shaped active portion placed above the first well, a non-active portion placed above an insulating area placed in the upper portion of the substrate between the first and second wells, and an active end portion placed above the second well; and drain and source areas of the second doping type are placed at the surface of the first well respectively inside and outside, in top view, of the active ring-shaped portion.

2. The memory point of claim 1, wherein the thick insulating layers are placed in the upper portion of the substrate and insulate a plurality of wells formed in the semiconductor substrate.

3. The memory point of claim 1, further comprising means for electron transfer from said N-type doped area, forming a well of storage of electrons injected into the floating gate in a programming operation, towards all or part of the active portions.

4. The memory point of claim 3, wherein said transfer means comprise at least one coupling electrode placed close to said at least one N-type doped area and separated therefrom by an insulating portion, said at least one coupling electrode being connected to a biasing electrode.

5. The memory point of claim 1, wherein the ring-shaped active portion and the end active portion are P-type doped and the inactive portion is N-type doped.

6. The memory point of claim 1, wherein the ring-shaped active portion and the end active portion are P-type doped, and the inactive portion comprises several N-type doped areas separated from one another by P-type doped areas.

7. The memory point of claim 1, wherein the ring-shaped active portion and the end active portion are P-type doped, the inactive portion comprising a P-type doped rectilinear portion exhibiting lateral prominences having N-type doped ends.

8. The memory point of claim 1, comprising electrode areas placed close to the inactive portion and exhibiting prominences placed close to the N-type doped areas.

9. A non-volatile memory cell comprising:
a substrate;
a first transistor formed in the substrate; and
a second transistor formed in the substrate, the first and second transistors including a common floating gate comprising a first active portion associated with the first transistor and insulated from the substrate by a thin insulating layer, a second active portion associated with the second transistor and insulated from the substrate by a thin insulating layer, and an intermediate portion insulated from the substrate by a thick insulating layer, the floating gate including at least one PN junction, wherein the thick insulating layer is formed in an upper portion of the substrate and insulates wells associated with the first and second transistors.

10. The non-volatile memory cell as defined in claim 9, wherein each of the first and second active portions has a P-type doped area and the intermediate portion includes at least one N-type doped area.

11. The non-volatile memory cell as defined in claim 9, further comprising at least one electrode to enhance transfer of electrons from the intermediate portion to the first and second active portions of the floating gate.

12. The non-volatile memory cell as defined in claim 9, further comprising at least one coupling electrode placed close to the intermediate portion and separated therefrom by an insulating portion, to enhance transfer of electrons from the intermediate portion to the first and second active portions of the floating gate.

13. A non-volatile memory cell comprising:
a substrate;
a first transistor formed in the substrate;
a second transistor formed in the substrate, the first and second transistors including a common floating gate comprising a first active portion associated with the first transistor and insulated from the substrate by a thin insulating layer, a second active portion associated with the second transistor and insulated from the substrate by a thin insulating layer, and an intermediate portion insulated from the substrate by a thick insulating layer, the floating gate including at least one PN junction; and
first and second wells of a first doping type in the upper portion of the substrate under the first and second transistors, respectively, the first active portion comprising a ring-shaped active portion above the first well, drain and source areas of the first transistor being placed at the surface of the first well inside and outside, respectively, of the ring-shaped active portion.

14. The non-volatile memory cell as defined in claim 13, wherein the intermediate portion is placed above the thick insulating layer between the first and second wells, and the second active portion is placed above the second well.

15. The memory cell as defined in claim 14, wherein the ring-shaped active portion and the second active portion are P-type doped and the intermediate portion is N-type doped.

16. The memory cell as defined in claim 14, wherein the ring-shaped active portion and the second active portion are P-type doped areas, and the intermediate portion comprises N-type doped areas and P-type doped areas forming two or more PN junctions.

17. The memory cell as defined in claim 16, further comprising at least one coupling electrode adjacent to the intermediate portion and having projections in close proximity to the N-type doped areas.

18. The memory cell as defined in claim 14, wherein the ring-shaped active portion and the second active portion are P-type doped areas, and the intermediate portion comprises a P-type doped central area having lateral projections with N-type doped ends.

19. The memory cell as defined in claim 18, further comprising at least one coupling electrode adjacent to the intermediate portion of the floating gate and having projections in close proximity to the N-type doped ends.

* * * * *